United States Patent [19]
Nam

[11] Patent Number: 5,986,295
[45] Date of Patent: Nov. 16, 1999

[54] CHARGE COUPLED DEVICE

[75] Inventor: Jung-hyun Nam, Kyungki-do, Rep. of Korea

[73] Assignee: Samsung Electronics Co., Rep. of Korea

[21] Appl. No.: 08/772,183

[22] Filed: Dec. 19, 1996

[30] Foreign Application Priority Data

Dec. 28, 1995 [KR] Rep. of Korea ............... 95-62180

[51] Int. Cl.⁶ .................. H01L 27/148; H01L 29/768
[52] U.S. Cl. ..................... 257/215; 257/248; 257/250
[58] Field of Search .......................... 257/215, 236, 257/239, 241, 248, 250

[56] References Cited

U.S. PATENT DOCUMENTS

| | | | |
|---|---|---|---|
| 3,943,543 | 3/1976 | Caywood | 257/250 |
| 4,097,885 | 6/1978 | Walsh | 257/248 |
| 4,148,132 | 4/1979 | Bower | 257/248 |
| 4,831,425 | 5/1989 | Pals et al. | 357/24 |
| 5,270,559 | 12/1993 | Yariv et al. | 257/249 |
| 5,369,293 | 11/1994 | Slob | 257/241 |

*Primary Examiner*—Mahshid Saadat
*Assistant Examiner*—Jesse A. Fenty
*Attorney, Agent, or Firm*—Myers Bigel Sibley & Sajovec

[57] ABSTRACT

A charge coupled device and a manufacturing method therefor are provided. The charge coupled device has a transfer electrode portion having a first gate electrode, a second gate electrode having an end portion partially overlapping an end portion of the first gate electrode, and a third gate electrode having one end portion partially overlapping the other end portion of the first gate electrode and the other end portion thereof partially overlapping the other end portion of the second gate electrode. The charge coupled device also has a charge transfer portion located in a semiconductor substrate under the first, second and third gate electrodes, which includes a first potential area formed in the semiconductor substrate under the second gate electrode and a second potential area formed in the semiconductor substrate under the third gate electrode. The charge coupled device further has a clock portion which includes a first clock terminal connected to the first and third gate electrodes, and a second clock terminal connected to the second gate electrode. This charge coupled device may prevent unnecessary local potential barriers or wells produced by a misalignment, and thus may provide increased charge transfer efficiency.

11 Claims, 5 Drawing Sheets

CHARGE COUPLED DEVICE

BACKGROUND OF THE INVENTION

The present invention relates to a semiconductor device and a manufacturing method therefor, and more particularly, to a charge coupled device which enables charge transfer and a manufacturing method therefor.

A charge coupled device (CCD), as a kind of charge transfer device, is a dynamic device which transfers charge via a predetermined path according to clock pulses applied to a gate electrode. The CCD is constituted of metal oxide semiconductor (MOS) transistors of which the gates are connected to one another in series.

The CCD having the characteristic of charge transfer via a predetermined path is widely used as an image device which is combined with a group of photo-diodes arranged in parallel to the CCD in order to sense an optical signal. The CCD also finds its use in various fields of analog and digital signal processing, using its ability of charge accumulation and transfer.

The first CCD suggested by Bell and Smith in 1969 includes an insulation layer and gate electrodes arranged to constitute a MOS capacitor on a semiconductor substrate. This simple planar arrangement of gate electrodes makes it difficult to control the shapes of a potential well under the gate electrodes. Therefore, a structure has been suggested in which a gate electrodes are isolated from one another while being partially overlapped with each other. The structure which has been most widely used is composed of a plurality of gate electrodes formed on a semiconductor substrate having insulation layers formed therebetween, and charge transfer areas formed under the gate electrodes.

Charge-coupled devices are divided into a pseudo 2-phase CCD, a 3-phase CCD, and a 4-phase CCD according to a driving method, and the structural configurations of the CCDs are modified in accordance with their driving methods. Especially, the pseudo 2-phase CCD uses simple driving pulses despite its low capacity of charge transfer as compared with other configurations, thus it is widely used as a horizontal charge transfer device of a CCD-type image device requiring high speed operation.

FIG. 1 is a sectional view of a conventional charge coupled device.

The conventional charge coupled device has first gate electrodes 16 spaced from one another by a predetermined distance, second gate electrodes 18 positioned between each first gate electrode 16, and potential areas 14 formed under the second gate electrodes 18. A first clock terminal φ1 is connected to a first gate electrode 16 and a second gate electrode 18 which form a unit transfer group, and a second clock terminal φ2 is connected to a first gate electrode 16 and a second gate electrode 18 which form another unit transfer group.

The potential areas 14 are formed by ion implantation using the first gate electrodes 16 as a mask, and thus are aligned with the first gate electrodes 16. In addition, the potential areas 14 form potential wells in a charge transferring direction.

Mutually opposite clock signals are applied to the first and second clock terminals φ1 and φ2.

In FIG. 1, reference numeral 10 denotes a semiconductor substrate, reference numeral 12 denotes a buried channel for a buried CCD, and reference numeral 20 denotes an interlayer insulation layer.

FIG. 2 is a potential distribution diagram explaining the migration of charge of the charge coupled device of FIG. 1.

Charge stored in a potential well in the left side of FIG. 2 migrates to the right when a clock pulse is applied to the first and second clock terminals φ1 and φ2. In FIG. 2, an arrow indicates the direction of charge transfer.

The aforementioned pseudo 2-phase CCD of FIG. 1 has limits in reducing the length of charge transfer groups due to the application of a single clock pulse to two gate electrodes. That is, a reduction in the length of a unit gate electrode is limited due to resolution limitation during photolithography.

When as many transfer groups as possible are needed in an area of a given unit length as in a horizontal charge coupled device of a CCD-type image device, the above limits emerge as a serious problem. To avoid this problem, a method has been suggested in which a single gate electrode is used as a unit transfer group by forming a potential area below only half the area of each gate electrode, as shown in FIG. 3.

FIG. 3 is a sectional view for explaining another conventional charge coupled device.

The charge coupled device of FIG. 3 is the same as that of FIG. 2 in terms of the arrangement of the first and second gate electrodes 16 and 18. However, a potential area 15 is formed under each of the first and second gate electrodes 16 and 18. Furthermore, a single gate electrode is connected to each of the clock terminals φ1 and φ2.

Therefore, according to the charge coupled device of FIG. 3, the size of the area reserved for the charge coupled device can be reduced by at least half of the area of the charge coupled device of FIG. 1. That is, assuming that the sizes of horizontal charge transfer devices of a CCD-type image device are the same, the case of FIG. 3 can secure twice as many transfer groups as compared with the case of FIG. 1.

Meanwhile, in the case of the charge coupled device of FIG. 3, in order to form the potential area 15, ion implantation should be performed after an ion implantation mask is formed using photolithography. In this case, it is impossible to align each potential area 15 with each of the gate electrodes 16 and 18. Thus, there is a likelihood that an unnecessary local potential barrier or well is formed due to the misalignment of a potential area and a gate electrode at a gate electrode boundary, thereby lowering charge transfer efficiency.

SUMMARY OF THE INVENTION

An object of the present invention is to provide a charge coupled device in which a potential area is formed to be aligned with a gate electrode and the area occupied by a unit transfer group is reduced.

Another object of the present invention is to provide a method for manufacturing the above charge coupled device.

To achieve the above object, there is provided a charge coupled device comprising: a transfer electrode portion having a first gate electrode, a second gate electrode having an end portion partially overlapping an end portion of the first gate electrode, and a third gate electrode having one end portion partially overlapping the other end portion of the first gate electrode and the other end portion thereof partially overlapping the other end portion of the second gate electrode; a charge transfer portion located in a semiconductor substrate under the first to third gate electrodes, and having a first potential area partially formed in the semiconductor substrate under the second gate electrode and a second potential area formed in the semiconductor substrate under the third gate electrode; and a clock portion having a first clock terminal simultaneously connected to the first and third gate electrodes, and a second clock terminal connected to the second gate electrode.

It is preferable that the length of the second gate electrode is equal to the sum of the lengths of the first and third gate electrodes.

It is preferable that the size of the first potential area is the same as that of the second potential area.

It is preferable that an end portion of the first potential area is aligned with an end portion of the first gate electrode, and the end portions of the second potential area are aligned with end portions of the first and second gate electrodes.

To achieve another object, there is provided a method for manufacturing a charge coupled device comprising the steps of: (a) forming a gate insulation layer on the overall surface of a semiconductor substrate; (b) forming a first gate electrode on the resultant structure having the gate insulation layer formed thereon; (c) coating the surface of the first gate electrode with a first insulation layer; (d) forming a photoresist pattern on the resultant structure including the first insulation layer, for exposing a portion of the first gate electrode and an area reserved for the formation of a second gate electrode; (e) forming a first potential area by implanting impurity ions, using the photoresist pattern as an ion implantation mask; (f) forming the second gate electrode on the area reserved for forming the second gate electrode so that an end portion thereof partially overlapping an end portion of the first gate electrode; (g) coating the surface of the second gate electrode with a second insulation layer; (h) forming a second potential area in the semiconductor substrate for forming the third gate electrode therein by implanting impurity ions, using the first and second gate electrodes as an ion implantation mask; (i) forming a third gate electrode on the area reserved for forming the third gate electrode so that an end portion thereof overlaps the other end portion of the first gate electrode and an end portion thereof partially overlaps the other end portion of the second gate electrode; and (j) connecting the first and third gate electrodes to a first clock terminal, and connecting the third gate electrode to a second clock terminal.

It is preferable the size of the first potential area is the same as that of the second potential area.

It is preferable that the second potential area is formed of impurity ions of the same type and concentration as that of impurity ions of the first potential area.

It is preferable to add the step of forming a buried channel layer near the surface of the semiconductor substrate, before the step (a).

Therefore, according to the charge coupled device and the manufacturing method therefor, the area occupied by a unit transfer group can be reduced and a potential area is formed to be aligned with a gate electrode.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 4:
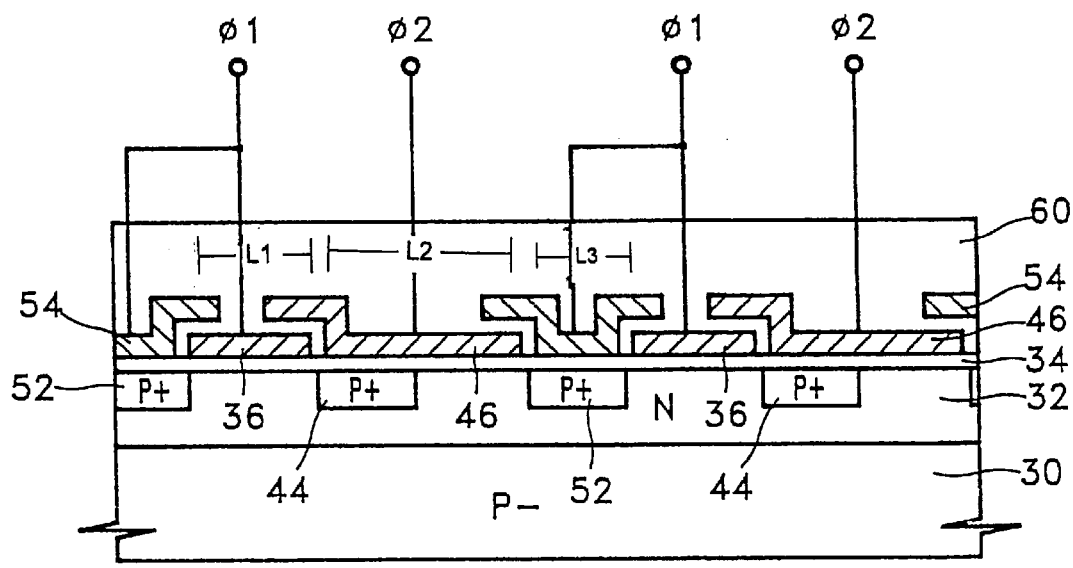
FIG. 4 is a sectional view of a charge coupled device manufactured using the method of the present invention.

A charge coupled device shown in FIG. 4 has a transfer electrode portion, a charge transfer portion, and a clock portion.

Transfer Electrode Portion

The transfer electrode portion has a plurality of first gate electrodes 36, a plurality of second gate electrodes 46 each having an end portion partially overlapping one end portion of each first gate electrode 36, and a plurality of third gate electrodes 54 having one end portion partially overlapping the other end portion of each first gate electrode 36 and the other end portion partially overlapping the other end portion of each second gate electrode 46.

Charge Transfer Portion

The charge transfer portion has a plurality of first potential areas 44 formed in a semiconductor substrate under the second gate electrode 46, and a plurality of second potential areas 52 formed in the semiconductor substrate under the third gate electrode 54.

Clock Portion

The clock portion has a plurality of first clock terminals $\phi 1$ simultaneously connected to each first and third gate electrode 36 and 54, and a plurality of second clock terminals $\phi 2$ connected to each second gate electrode 46.

The length of each second gate electrode 46 is equal to the sum of the lengths of the first and third gate electrodes 36 and 54, and the configuration and size of each first potential area 44 is the same as that of each second potential area 52.

In addition, an end portion of each first potential area 44 is aligned with an end portion of each first gate electrode 36, and the second potential area 52 are aligned with the first gate electrodes 36 and the second gate electrode 46.

The first and second potential areas 44 and 52 form a potential well in a charge transferring direction, and mutually opposite clock signals are applied to the first and second clock terminals $\phi 1$ and $\phi 2$.

According to the charge coupled device of the present invention, since the potential areas are aligned with the gate electrodes, reduction of charge efficiency due to the formation of an unnecessary local potential barrier or well is prevented.

The portions of FIG. 4 which were not described will be described with reference to FIGS. 5A to 5G.

Figure 5A:
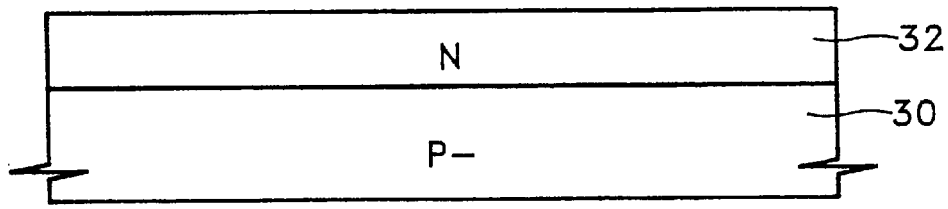
FIGS. 5A to 5G are sectional views of the steps for manufacturing a charge coupled device according to the present invention.

FIG. 5A illustrates the step of forming a buried channel layer 32 in a semiconductor substrate 30. The buried channel layer 32 is formed by implanting N-type ions into the overall surface of a P-type semiconductor substrate 30.

Here, the buried channel layer 32 is formed as a path for the migration of charge. A charge coupled device having the buried channel layer 32 near the surface of the semiconductor substrate 30 as shown in FIG. 5A is referred to as a buried CCD (BCCD), whereas a charge coupled device having no buried channel layer is referred to as a surface CCD (SCCD).

Though a CCD having the buried channel layer 32 is described in this embodiment, the effects of the present invention can be achieved without it.

Figure 5B:
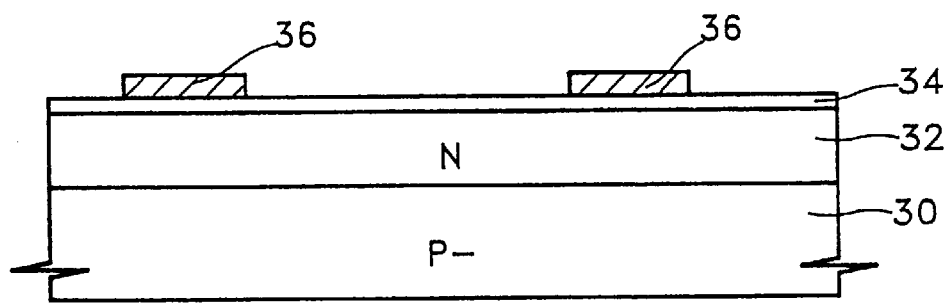

FIG. 5B illustrates the step of forming the first gate electrodes 36 wherein, a gate insulation layer 34 is formed by growing, for example, silicon dioxide, on the overall surface of the semiconductor substrate 30 having the buried channel layer 32 formed therein. A first conductive material layer (not shown) of, for example, polysilicon, which will be the first gate electrodes 36, is formed on the overall surface of the gate insulation layer 34. Then, the first gate electrodes 36 are formed to be spaced from each other by a predetermined distance by performing a photolithography on the conductive material layer.

Figure 5C:
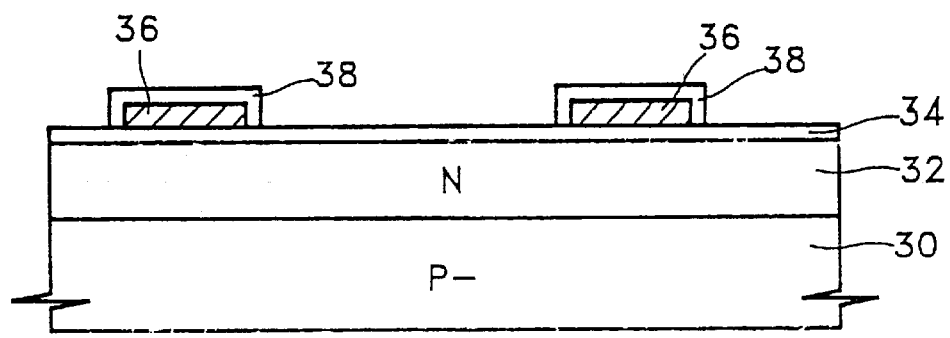

FIG. 5C illustrates the step of forming the first gate insulation layers 38 wherein, the first gate insulation layers 38 are formed of silicon dioxide by exposing the surfaces of the first gate electrodes 36 to oxygen atmosphere. Here, the first insulation layers 38 entirely cover the first gate electrodes 36.

Figure 5D:
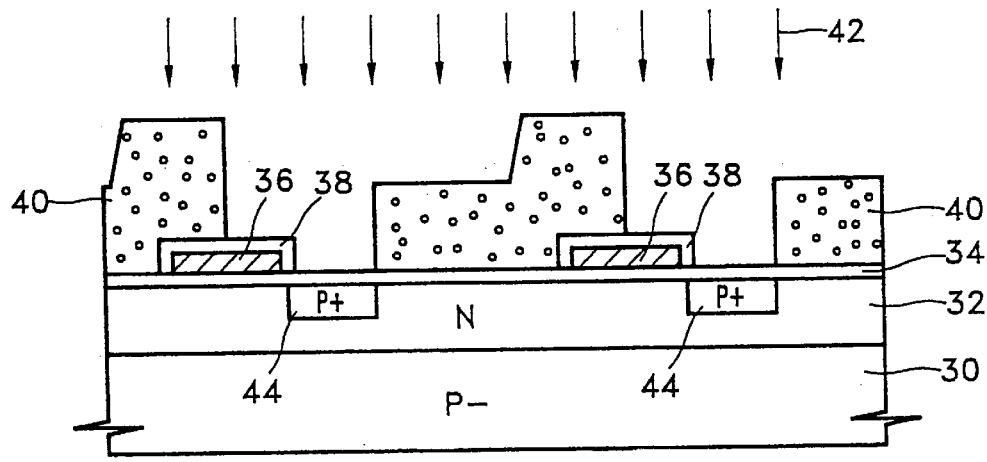

FIG. 5D illustrates the step of forming the first potential areas 44 wherein, photoresist patterns 40 are formed to expose a portion of the first gate electrodes 36 and areas for forming second gate electrodes by coating and developing a photoresist film on the overall resultant structure. Then, the first potential areas 44 are formed in a portion of an area reserved for the second gate electrodes by implanting impurity ions 42, using the photoresist patterns 40 as an ion implantation mask.

Here, the photoresist patterns 40 are formed to expose the right end portions of the first gate electrodes 36 and the left portions of the areas in which the second gate electrodes will be formed. Therefore, the first potential areas 44 are formed so that their left end portions are aligned with the first gate electrodes 36, and their right end portions are aligned with the photoresist patterns 40.

In addition, the impurity ions 42 are P-type ions when the buried channel layer 32 is N-type.

Figure 5E:
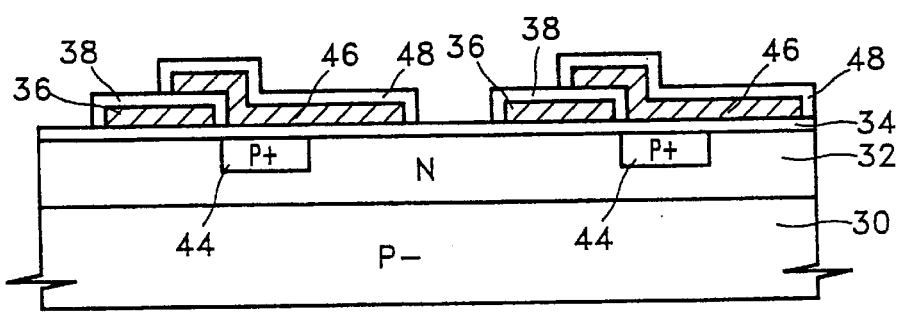

FIG. 5E illustrates the step of forming the second gate electrodes 46 wherein the photoresist pattern 40 of FIG. 5D is removed, and a second conductive material layer (not shown) of, for example, polysilicon, which will be the second gate electrodes 46, is formed on the overall surface of the resultant structure. Then, the second gate electrodes 46 are formed by patterning the second conductive layer, and second insulation layers 48 are formed on the surfaces of the second gate electrodes 46.

The second gate electrodes 46 are formed so that their left end portions partially overlap the right end portions of the first gate electrodes 36, and their right end portions are positioned near the third gate electrode areas.

Here, second insulation layers 48 are formed in the same manner as that for the first insulation layers 38.

Figure 5F:
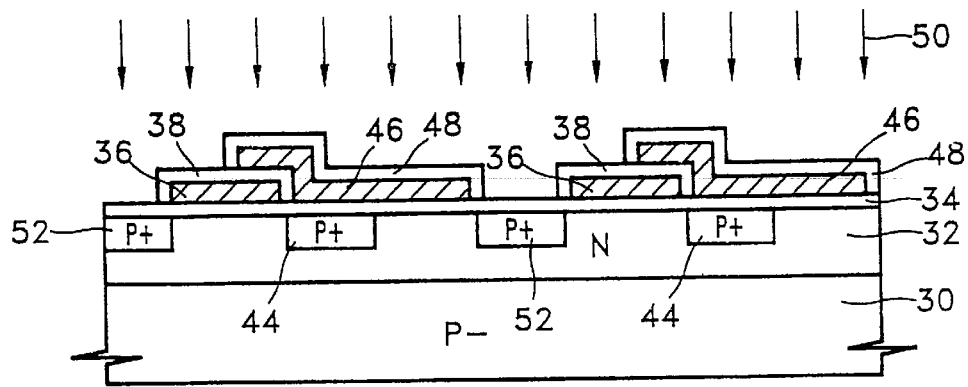

FIG. 5F illustrates the step of forming the second potential areas 52 wherein, the second potential areas 52 are formed on the semiconductor substrate of an area reserved for the third gate electrodes by implanting, for example, P-type impurity ions 50 into the overall surface of the semiconductor substrate 30 having the first and second gate electrodes 36 and 46 formed therein.

Here, the second potential areas 52 should be identical to the first potential areas 44 in terms of shape and size, and formed to have the same impurity ions at the same concentration as that of the first potential area 44.

In addition, the second potential areas 52 are formed so that their right end portions are aligned with the left end portions of the first gate electrodes 36, and their left end portions are aligned with the right end portions of the second gate electrodes 46.

Figure 5G:
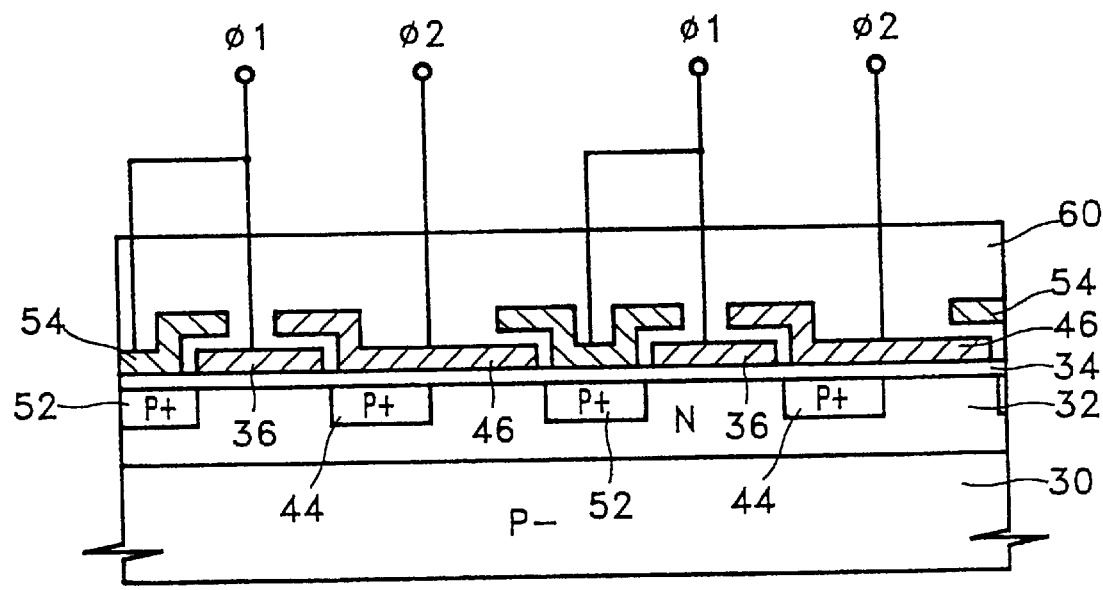

FIG. 5G illustrates the step of forming the third gate electrodes 54 wherein, a third conductive material layer (not shown), which will be the third gate electrodes 54, is formed by depositing, for example, polysilicon on the overall surface of the resultant structure. Then, the third gate electrodes 54 are formed on the semiconductor substrate of an area reserved for the third gate electrodes by patterning the third conductive material layer. A third insulation layer (not shown) is formed on the surface of the third gate electrodes 54, and then an insulation layer 60 is formed on the overall surface of the resultant structure.

The third gate electrodes 54 are formed so that their right end portions partially overlap the left end portions of the first gate electrodes 36, and their left end portions partially overlap the right end portions of the second gate electrode 46.

Here, the third insulation layer (not shown) is formed in the same manner as that for the first and second insulation layers 38 and 48 of FIG. 5E.

The first and third gate electrodes 36 and 54 are connected to the first clock terminal $\phi 1$, thus forming a unit transfer group, and the second gate electrode 46 is connected to the second clock terminal $\phi 2$, thus forming another unit transfer group. Charge accumulated in the buried channel layer 32 under the gate electrodes 36, 46, and 54 is transferred in a predetermined direction according to clock pulses applied to the first and second clock terminals $\phi 1$ and $\phi 2$.

Though a preferred embodiment using electrons as a charge carrier has been described with reference to FIGS. 5A to 5G (for example, the first conductive type and the second conductive type were defined as P and N, respectively), anyone skilled in the art will know that impurity ions of the conductive type opposite to that described should be used when holes are used as a charge carrier. In addition, the gate insulation layer formation step and the impurity-ion implantation step for forming a potential area may be reversed, if necessary, with the same effects.

Therefore, according to the charge coupled device and manufacturing method therefor, the area occupied by a unit transfer group can be reduced and a potential area can be accurately aligned with a gate electrode. Consequently, an unnecessary local potential barrier or well produced by a misalignment can be prevented, thereby increasing charge transfer efficiency.

The present invention is not limited to the above embodiment, and it is clearly understood that many variations are possible within the scope and spirit of the present invention by anyone skilled in the art.

What is claimed is:

1. A charge coupled device comprising:
   a transfer electrode portion having not more than a first gate electrode, a second gate electrode and a third gate electrode wherein said second gate electrode and said third gate electrode partially overlap said first gate electrode;
   a charge transfer portion located in a semiconductor substrate under said first, second and third gate electrodes;
   a clock portion having a first clock terminal connected to said first and third gate electrodes, and a second clock terminal connected to said second gate electrode.

2. The charge coupled device according to claim 1, further comprising first and second potential areas formed in said semiconductor substrate, wherein said first potential area is formed under said second gate electrode and wherein said second potential area is formed under said third gate electrode.

3. The charge coupled device according to claim 2, wherein an end portion of said first potential area is substantially aligned with an end portion of said first gate electrode and the other end portion of said first potential area is aligned with a middle portion of said second gate electrode, and wherein an end portion of said second potential area is substantially aligned with the other end portion of said first gate electrode.

4. The charge coupled device according to claim 3, wherein the size of said first potential area is the same as that of said second potential area.

5. A charge coupled device comprising:
- a transfer electrode portion having not more than a first gate electrode, a second gate electrode and a third gate electrode;
- a charge transfer portion located in a semiconductor substrate under said first to third gate electrodes, and having a first potential area formed in said semiconductor substrate under said second gate electrode and a second potential area formed in said semiconductor substrate under said third gate electrode; and
- a first clock terminal connected to said first and third gate electrodes, and a second clock terminal connected to said second gate electrode;
- wherein said second gate electrode has a first end overlapping a first end of said first gate electrode and a second end which is disposed between said charge transfer portion and at least part of a gate electrode of an adjacent group of first, second and third gate electrodes; and
- wherein said third gate electrode has a first end overlapping a second end of said first gate electrode.

6. A charge coupled device as claimed in claim 5, wherein the size of said first potential area is the same as that of said second potential area.

7. A charge coupled device as claimed in claim 6, wherein an end portion of said first potential area is aligned with an end portion of said first gate electrode and the other end portion of said first potential area is aligned with a middle portion of said second gate electrode, and the end portions of said second potential area are aligned with the other end portion of said first gate electrode and an end portion of a gate electrode in an adjacent group of first, second and third gate electrodes.

8. A charge coupled device comprising:
- a transfer electrode portion having not more than a first gate electrode, a second gate electrode and a third gate electrode wherein said second gate electrode and said third gate electrode partially overlap said first gate electrode;
- a charge transfer portion located in a semiconductor substrate under said first, second and third gate electrodes;
- a clock portion having a first clock terminal connected to said first and third gate electrodes, and a second clock terminal connected to said second gate electrode; and
- an insulating layer disposed between said transfer electrode portion and said charge transfer portion, wherein a first end portion of said second gate electrode partially overlaps said first gate electrode and wherein a second end portion of said second gate electrode contacts said insulating layer and wherein said third gate electrode partially overlaps said first gate electrode.

9. A charge coupled device comprising:
- a transfer electrode portion having a plurality of groups of first, second and third gate electrodes, wherein in each of said groups a first end of said second gate electrode overlaps a first end of said first gate electrode, a first end of said third gate electrode overlaps a second end of said first gate electrode and a second end of said third gate electrode overlaps a second end of the second gate electrode in an adjacent group of first, second and third gate electrodes;
- a charge transfer portion located in a semiconductor substrate under said plurality of groups of first, second and third gate electrodes;
- first and second clock terminals connected to said transfer electrode portion;
- a plurality of first and second potential areas formed in said semiconductor substrate, wherein said first potential areas are formed under said second gate electrodes and wherein said second potential areas are formed under said third gate electrodes; and
- wherein in each of said groups an end portion of said first potential area is aligned with an end portion of said first gate electrode, and wherein the end portions of said second potential area are aligned with the other end portion of said first gate electrode and an end portion of the second gate electrode in an adjacent group of first, second and third gate electrodes.

10. The charge coupled device according to claim 9, wherein said first clock terminal is connected to each of said first and third gate electrodes in said plurality of groups of first, second and third gate electrodes, and said second clock terminal is connected to each of said second gate electrodes in said plurality of groups of first, second and third gate electrodes.

11. The charge coupled device according to claim 9, wherein the first gate electrodes in each group are shaped substantially the same, wherein the second gate electrodes in each group are shaped substantially the same and wherein the third gate electrodes in each group are shaped substantially the same.

* * * * *

UNITED STATES PATENT AND TRADEMARK OFFICE
CERTIFICATE OF CORRECTION

PATENT NO.   : 5,986,295
DATED        : November 16, 1999
INVENTOR(S)  : Nam

It is certified that error appears in the above-identified patent and that said Letters Patent is hereby corrected as shown below:

Beginning with column 1 ending with column 7, line 6, replace the specification with the attached pages.

Signed and Sealed this

Eighth Day of October, 2002

Attest:

Attesting Officer

JAMES E. ROGAN
Director of the United States Patent and Trademark Office

CHARGE COUPLED DEVICES AND MANUFACTURING METHODS THEREFOR

Field of the Invention

The present invention relates to semiconductor devices and manufacturing methods therefor, and more particularly, to charge coupled devices which enable
5   charge transfer and manufacturing methods therefor.

Background of the Invention

Charge coupled devices are dynamic charge transfer devices which transfer charge via a predetermined path
10   according to clock pulses applied to a gate electrode. A charge coupled device may be constituted of metal oxide semiconductor (MOS) transistors which are connected in series to one another via their gates.

Charge coupled devices are widely used as imaging
15   devices, whereby the charge coupled device is combined in parallel to a group of photo-diodes to form a device capable of sensing optical signals. Charge coupled devices are also used in various analog and digital signal processing applications.
20   Early charge coupled devices, such as the one suggested by Bell and Smith in 1969, comprised an acceptance has a plurality of gate electrodes formed on a
semiconductor substrate with insulation layers formed
therebetween, and charge transfer areas formed under the
gate electrodes.

Charge-coupled devices are divided into a pseudo 2-phase charge coupled device, 3-phase charge coupled devices, and 4-phase charge coupled devices according to their driving method, and the structural configurations of the charge coupled devices are modified in accordance with their driving methods. The pseudo 2-phase charge coupled device uses simple driving pulses, despite its low capacity of charge transfer as compared with other configurations, thus it is widely used as a horizontal charge transfer device of a charge coupled device-type image device requiring high speed operation.

Figure 1:
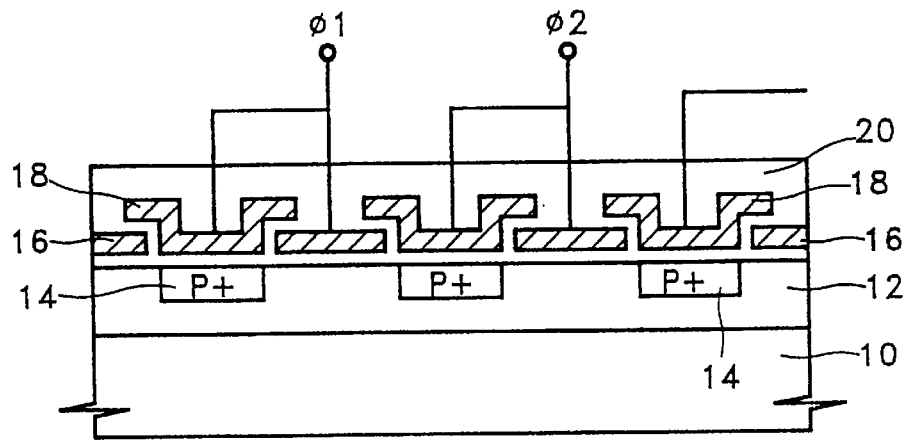
FIG. 1 is a sectional view of a conventional charge coupled device.

FIG. 1 is a sectional view of a conventional pseudo 2-phase charge coupled device. In FIG. 1, reference numeral 10 denotes a semiconductor substrate, reference numeral 12 denotes a buried channel for a buried charge coupled device, and reference numeral 20 denotes an interlayer insulation layer. As illustrated in FIG. 1, such a conventional charge coupled device has first gate electrodes 16 spaced from one another by a predetermined distance, second gate electrodes 18 positioned between the first gate electrodes 16, and potential areas 14 formed under the second gate electrodes 18. A first clock terminal $\phi 1$ is connected to a first gate electrode 16 and a second gate electrode 18 to form a unit transfer group, and a second clock terminal $\phi 2$ is connected to a first gate electrode 16 and a second gate electrode 18 to form another unit transfer group. Mutually opposite clock signals are applied to the first and second clock terminals $\phi 1$ and $\phi 2$.

The potential areas 14 are formed by ion implantation using the first gate electrodes 16 as a mask, and thus potential areas 14 are aligned with the first gate electrodes 16. These potential areas 14 form potential wells in a charge transferring direction.

Figure 2:
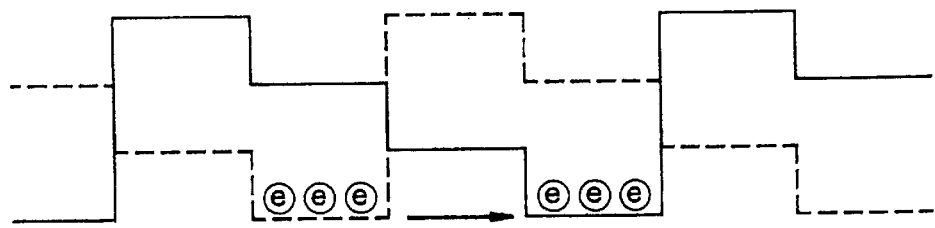
FIG. 2 is a potential distribution view explaining the migration of charge of the charge coupled device shown in FIG. 1.

The migration of charge of the charge coupled device of FIG. 1 is illustrated in the potential distribution diagram of FIG. 2. Referring to FIG. 2, charge stored in a potential well in the left side of the figure migrates to the right when a clock pulse is applied to the first and second clock terminals $\phi 1$ and $\phi 2$. The arrow in FIG. 2 indicates the direction of charge transfer.

In many applications, such as high speed horizontal charge coupled devices of a charge coupled device-type image device, it is desirable to form as many transfer groups as possible in an area of a given unit length. However, as the pseudo 2-phase charge coupled device of FIG. 1 applies a single clock pulse to two gate electrodes, limitations in the resolution achievable during photolithography place a limit on the minimum length of the charge transfer groups. Such limits emerge as a serious problem in applications requiring a large number of charge transfer groups per unit area.

To avoid the above-mentioned problem, a device has been suggested in which a single gate electrode is used as a unit transfer group by forming a potential area below only half the area of each gate electrode. Such a device is illustrated in FIG. 3.

Figure 3:
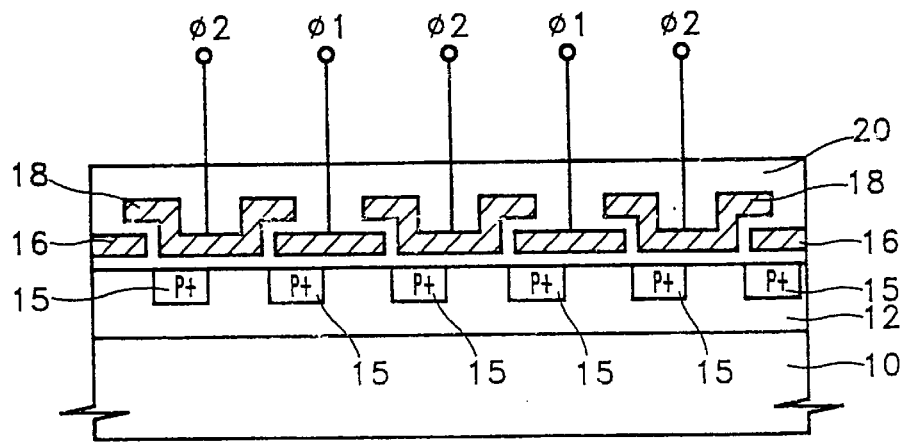
FIG. 3 is a sectional view of another conventional charge coupled device.

The charge coupled device depicted in FIG. 3 is identical to the charge coupled device depicted in FIG. 1 in terms of the arrangement of the first and second gate electrodes 16 and 18. However, a potential area is 15 formed under each of the first and second gate electrodes 16 and 18, and each of the clock terminals $\phi 1$ and $\phi 2$ are connected to only a single gate electrode. Through these modifications, the size of the area reserved for the charge coupled device of FIG. 3 can be reduced to at

4 least half of the area of the charge coupled device of FIG. 1. Thus, if the sizes of horizontal charge transfer devices of a charge coupled device-type image device are comparable, the device of FIG. 3 can include twice as many charge transfer groups as the device of FIG. 1.

In fabricating the charge coupled device of FIG. 3, the potential area 15, may be formed via ion implantation after an ion implantation mask is formed using photolithography. However, when such a method is used, it may be difficult to align each potential area 15 with each of the gate electrodes 16 and 18. Thus, in the charge coupled devices of FIG. 3, there is a likelihood that an unnecessary local potential barrier or well is created due to the misalignment of a potential area and a gate electrode at a gate electrode boundary, thereby lowering charge transfer efficiency.

Summary of the Invention

In light of the aforementioned limitations with conventional charge coupled devices, it is an object of the present invention to provide a charge coupled device which provides higher charge transfer efficiency.

It is a second object of the present invention to provide a charge coupled device where the area occupied by a unit transfer group is reduced.

Yet another object of the present invention is to provide a method for manufacturing such a charge coupled device.

The above-stated objectives are provided by a charge coupled device which includes a transfer electrode portion having a first gate electrode, a second gate electrode which has an end portion that partially overlaps an end portion of the first gate electrode, and a third gate electrode which has one end portion partially overlapping the other end portion of the first gate electrode and the other end portion thereof
partially overlapping the other end portion of the second
gate electrode. This charge coupled device further
includes a charge transfer portion located in a
semiconductor substrate under the first, second and third
gate electrodes. The charge transfer portion has a first
potential area partially formed in the semiconductor
substrate under the second gate electrode and a second
potential area formed in the semiconductor substrate
under the third gate electrode. This charge coupled
device also includes a clock portion comprising a first
clock terminal that is simultaneously connected to both
the first and third gate electrodes, and a second clock
terminal that is connected to the second gate electrode.

In one embodiment of the present invention, the
length of the second gate electrode is equal to the sum
of the lengths of the first and third gate electrodes.
In another embodiment of the present invention, the size
of the first potential area is the same as that of the
second potential area. In still another embodiment of
the present invention, an end portion of the first
potential area is aligned with an end portion of the
first gate electrode, and the end portions of the second
potential area are aligned with end portions of the first
and second gate electrodes.

In another aspect of the present invention, there is
provided a method for manufacturing a charge coupled
device comprising the steps of: (a) forming a first gate
electrode on a gate insulation layer formed on a region
of semiconductor material; (b) coating an exposed surface
of the first gate electrode with a first insulation
layer; (c) forming a photoresist pattern on the first
insulation layer and the gate insulation layer, wherein
the photoresist layer is patterned so as to expose
portions of the first insulation layer and the first gate insulation layer adjacent the first insulation layer; (d) forming a first potential area by implanting impurity ions, using the photoresist pattern and the first gate electrode as an ion implantation mask; (e) forming a second gate electrode wherein an end portion thereof partially overlaps an end portion of the first gate electrode; (f) forming a second insulation layer on exposed surfaces of the second gate electrode; (g) forming a second potential area in the semiconductor substrate by implanting impurity ions, using the first and second gate electrodes as an ion implantation mask; (h) forming a third gate electrode wherein an end portion thereof overlaps an end portion of the first gate electrode opposite the second gate electrode and an end portion thereof overlaps an end portion of the second gate electrode opposite the first gate electrode. Additionally, a buried channel layer may be formed near the surface of the semiconductor substrate, and the first and third gate electrodes may be connected to a first clock terminal, and the third gate electrode may be connected to a second clock terminal.

Therefore, according to the charge coupled devices and manufacturing methods of the present invention, the area occupied by a unit transfer group can be reduced and a potential area is formed to be aligned with a gate electrode.

Brief Description of the Drawings

The above objects and advantages of the present invention will become more apparent by describing in detail preferred embodiments thereof with reference to the attached drawings in which:

FIG. 1 is a sectional view of a conventional charge coupled device;

FIG. 2 is a potential distribution view illustrating the migration of charge of the charge coupled device shown in FIG. 1;

FIG. 3 is a sectional view of another conventional charge coupled device;

FIG. 4 is a sectional view of a charge coupled device according to the present invention; and

FIGS. 5A to 5G are sectional views of the steps for manufacturing a charge coupled device according to the present invention.

Detailed Description of the Invention

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those of skill in the art.

FIG. 4 illustrates a preferred embodiment of a charge coupled device according to the present invention. As shown in FIG. 4, the charge coupled device has a transfer electrode portion, a charge transfer portion, and a clock portion.

The transfer electrode portion has a plurality of first gate electrodes 36, a plurality of second gate electrodes 46 and a plurality of third gate electrodes 54. As illustrated in FIG. 4, the second gate electrodes 46 each have an end portion which partially overlaps one end portion of its adjacent first gate electrode 36. Similarly, one end portion of each of the third gate electrodes 54 partially overlaps the other end portion of each first gate electrode 36, and the other end portion of each of the third gate electrodes 54 partially
overlaps the other end portion of its adjacent second
gate electrode 46.

As is also illustrated in FIG. 4, the charge
transfer portion of the charge coupled device has a
plurality of first potential areas 44 which are formed in
the semiconductor substrate underlying the second gate
electrodes 46, and a plurality of second potential areas
52 which are formed in the semiconductor substrate
underlying the third gate electrodes 54.

The clock portion of the charge coupled device
illustrated in FIG. 4 comprises a plurality of first
clock terminals $\phi 1$ and a plurality of second clock
terminals $\phi 2$. Each of the first clock terminals $\phi 1$ are
simultaneously connected to adjacent first and third gate
electrodes 36 and 54, and each of the second clock
terminals $\phi 2$ are connected to a corresponding second gate
electrode 46.

As illustrated in FIG. 4, the length of each second
gate electrode 46 is equal to the sum of the lengths of
the first and third gate electrodes 36 and 54. The
configuration and size of each first potential area 44
preferably matches the configuration and size of each
second potential area 52. These first and second
potential areas 44 and 52 form a potential well in a
charge transferring direction, and mutually opposite
clock signals are applied to the first and second clock
terminals $\phi 1$ and $\phi 2$.

In a preferred embodiment of the present invention,
an end portion of each first potential area 44 is aligned
with an end portion of each first gate electrode 36. In
this embodiment, the end portions of the second potential
areas 52 are aligned with the other end portion of the
respective first gate electrodes 36 and one of the end portions of the respective second gate electrodes 46. Thus, according to the charge coupled device of the present invention, reduction of charge efficiency due to the formation of an unnecessary local potential barrier or well is prevented as the potential areas are aligned with the gate electrodes.

The portions of FIG. 4 which were not described will be described with reference to FIGS. 5B through 5G.

FIGS. 5A through 5G illustrate methods of forming charge coupled devices according to the present invention. FIG. 5A illustrates the step of forming a buried channel layer 32 in a semiconductor substrate 30. As shown in FIG. 5A, the buried channel layer 32 may be formed by implanting N-type ions into the overall surface of a P-type semiconductor substrate 30, as is well understood by those of skill in the art. As will also be understood by those of skill in the art, the buried channel layer 32 is formed as a path for the migration of charge. A charge coupled device having the buried channel layer 32 near the surface of the semiconductor substrate 30, as shown in FIG. 5A, is referred to as a buried charge coupled device (BCCD), whereas a charge coupled device having no buried channel layer is referred to as a surface charge coupled device (SCCD). Thus, although FIG. 5A depicts a charge coupled device having a buried channel layer 32, the scope of the present invention is not limited to BCCD devices and related methods of manufacture, but instead is as is set forth in the claims appended hereto.

FIG. 5B illustrates a method according to the present invention for forming the first gate electrodes 36, wherein a gate insulation layer 34 is formed by growing, for example, silicon dioxide, over the surface of buried channel layer 32. A first conductive material layer (not shown) of, for example, polysilicon, is then formed atop the surface of gate insulation layer 34. The first gate electrodes 36 may then be formed to be spaced from each other by a predetermined distance by selectively removing the conductive materials layer via photolithography.

FIG. 5C illustrates a method according to the present invention for forming the first gate insulation layers 38. Such first gate insulation layers 38 may be formed of silicon dioxide by exposing the surfaces of the first gate electrodes 36 to oxygen atmosphere. As illustrated in FIG. 5C, the first insulation layers 38 may entirely cover the respective first gate electrodes 36.

FIG. 5D illustrates a method according to the present invention for forming the first potential areas 44. As illustrated in the figure, photoresist patterns 40 may be formed by selectively applying and developing a photoresist film atop the device while leaving exposed a portion of the respective first gate electrodes 36 and areas for forming second gate electrodes. First potential areas 44 may then be formed in a portion of an area reserved for the second gate electrodes by implanting impurity ions 42, using the photoresist patterns 40 as an ion implantation mask. In the illustrated embodiment, the impurity ions 42 are P-type ions, as the buried channel layer 32 shown in FIG. 5D is N-type.

In the embodiment of the present invention illustrated in FIG. 5D, the photoresist patterns 40 are formed to expose the right end portions of the first gate electrodes 36 and the left portions of the areas in which the second gate electrodes will be formed. In this manner, the first potential areas 44 may be formed so that their left end portions are aligned with the first gate electrodes 36, and their right end portions are aligned with the photoresist patterns 40.

FIG. 5E illustrates a method according to the present invention for forming the second gate electrodes 46. As shown in the figure, the photoresist patterns 40 of FIG. 5D are removed, and a second conductive material layer (not shown) of, for example, polysilicon, may then be formed atop the device. Second gate electrodes 46 may then be formed by patterning the second conductive material layer in a manner similar to that described above with respect to formation of first gate electrodes 36. Thereafter, second insulation layers 48 may be formed atop the second gate electrodes 46. As will be understood by those of skill in the art, the second insulation layers 48 may be formed in the same manner as is described above with respect to the first insulation layers 38.

In a preferred embodiment of the present invention, the second gate electrodes 46 are formed so that their left end portions partially overlap the right end portions of the first gate electrodes 36, and their right end portions are positioned near the third gate electrode areas.

FIG. 5F illustrates a method according to the present invention for forming the second potential areas 52. As illustrated in FIG. 5F, the second potential areas 52 may be formed on the semiconductor substrate in the area reserved for the third gate electrodes 54 (described below) by implanting, for example, P-type impurity ions 50 atop the semiconductor substrate 30 having the first and second gate electrodes 36 and 46 formed therein. In this embodiment, the second potential areas 52 preferably are identical to the first potential areas 44 in terms of shape, size, and concentration of impurity ions. Moreover, preferably the second potential areas 52 are formed so that their right end portions are
aligned with the left end portions of the respective
first gate electrodes 36, and their left end portions are
aligned with the right end portions of the respective
second gate electrodes 46.

FIG. 5G illustrates a method according to the
present invention for forming the third gate electrodes
54, wherein a third conductive material layer (not shown)
is formed by depositing, for example, polysilicon atop
the surface of the device. Third gate electrodes 54 may
then be formed in their desired locations by patterning
the third conductive material layer. A third insulation
layer (not shown) may then be formed atop the third gate
electrodes 54 in a manner similar to that described above
for the first and second insulation layers 38 and 48 of
FIG. 5E, and then an insulation layer 60 may be formed
over the surface of the resultant structure. As
illustrated in FIG. 5G, in a preferred embodiment of the
present invention, the third gate electrodes 54 are
formed so that their right end portions partially overlap
the left end portions of the first gate electrodes 36,
while their left end portions partially overlap the right
end portions of the second gate electrodes 46.

As is also illustrated in FIG. 5G, the first and
third gate electrodes 36 and 54 may be connected to the
first clock terminal $\phi 1$ to form a unit transfer group,
and the second gate electrode 46 may be connected to the
second clock terminal $\phi 2$, to form another unit transfer
group. In this manner, charge accumulated in the buried
channel layer 32 under the gate electrodes 36, 46, and 54
may be transferred in a predetermined direction according
to clock pulses applied to the first and second clock
terminals $\phi 1$ and $\phi 2$.

Note that while a preferred embodiment using
electrons as a charge carrier has been described herein (for example, the first conductive type and the second conductive type were defined as P and N, respectively), those of skill in the art will understand that impurity ions of the conductive type opposite to that described should be used when holes are used as a charge carrier. Moreover, those of skill in the art will also understand that the gate insulation layer formation steps and the impurity-ion implantation steps for forming potential areas described herein may be reversed, if necessary, with the same effects.

Therefore, according to the charge coupled device and manufacturing method therefor described herein, the area occupied by a unit transfer group can be reduced and a potential area can be accurately aligned with a gate electrode. Consequently, an unnecessary local potential barrier or well produced by a misalignment can be prevented, thereby increasing charge transfer efficiency.

The present invention is not limited to the above embodiment, and it is clearly understood that many variations are possible within the scope and spirit of the present invention by those of skill in the art.

14

Abstract of the Disclosure

A charge coupled device and a manufacturing method therefor are provided.  The charge coupled device has a transfer electrode portion having a first gate electrode, a second gate electrode having an end portion partially overlapping an end portion of the first gate electrode, and a third gate electrode having one end portion partially overlapping the other end portion of the first gate electrode and the other end portion thereof partially overlapping the other end portion of the second gate electrode.  The charge coupled device also has a charge transfer portion located in a semiconductor substrate under the first, second and third gate electrodes, which includes a first potential area formed in the semiconductor substrate under the second gate electrode and a second potential area formed in the semiconductor substrate under the third gate electrode.  The charge coupled device further has a clock portion which includes a first clock terminal connected to the first and third gate electrodes, and a second clock terminal connected to the second gate electrode.  This charge coupled device may prevent unnecessary local potential barriers or wells produced by a misalignment, and thus may provide increased charge transfer efficiency.